United States Patent [19]

Bertin et al.

[11] 4,280,855
[45] Jul. 28, 1981

[54] METHOD OF MAKING A DUAL DMOS DEVICE BY ION IMPLANTATION AND DIFFUSION

[75] Inventors: Claude L. Bertin, South Burlington, Vt.; Francisco H. De La Moneda, Stormville, N.Y.; Donald A. Soderman, Saratoga, Calif.

[73] Assignee: IBM Corporation, Armonk, N.Y.

[21] Appl. No.: 114,484

[22] Filed: Jan. 23, 1980

[51] Int. Cl.$^3$ .................. H01L 7/44; H01L 21/26
[52] U.S. Cl. .................. 148/1.5; 148/187; 357/23; 357/91
[58] Field of Search .............. 148/1.5, 187; 357/23, 357/91

[56] References Cited

U.S. PATENT DOCUMENTS

| | | | |
|---|---|---|---|
| 3,919,007 | 11/1975 | Tarui | 148/189 |
| 3,996,655 | 12/1976 | Cunningham | 29/571 |
| 4,038,107 | 7/1977 | Marr et al. | 148/1.5 |
| 4,078,947 | 3/1978 | Johnson et al. | 148/1.5 |
| 4,108,686 | 8/1978 | Jacobus | 148/1.5 |
| 4,151,538 | 4/1979 | Polinsky et al. | 357/23 |
| 4,160,683 | 7/1979 | Roche | 148/187 |

OTHER PUBLICATIONS

Oleszek et al., IBM-TDB 21, (1978), 681.
Crowder et al., IBM-TDB 19, (1976), 2787.
Krick et al., IBM-TDB 15, (1972), 1884.

*Primary Examiner*—Upendra Roy
*Attorney, Agent, or Firm*—John E. Hoel

[57] ABSTRACT

A diffused MOS (DMOS) device and method for making same are disclosed. The prior art DMOS device is improved upon by ion implanting a depletion extension $L_D$ to the drain. However, the introduction of the depletion extension $L_D$ introduces a manufacturing statistical variation in the characteristics of the resultant devices so produced. The problem of the effects of the variations in the length $L_D$, and thus, variations in the resulting transconductance of the device, is solved by placing two of these devices in parallel. When one device has its $L_D$ relatively shorter, the companion device will also have its $L_D$ correspondingly longer. The method of producing the dual devices is by ion implanting a single conductivity region which forms the $L_D$ for both the left- and right-hand channels for the left- and right-hand DMOS structures. If the mask for the ion-implanted region is misaligned slightly to the right, then the effective $L_D$ for the right-hand channel is somewhat longer but the effective $L_D$ for the left-hand channel is correspondingly shorter, so that the net parallel transconductance for the two devices remains the same as the transconductance for a perfectly symmetric ion-implanted region.

7 Claims, 9 Drawing Figures

METHOD OF MAKING A DUAL DMOS DEVICE BY ION IMPLANTATION AND DIFFUSION

FIELD OF THE INVENTION

The invention disclosed broadly relates to semiconductor devices and more particularly relates to field effect transistor devices and methods for making same.

BACKGROUND OF THE INVENTION

Diffused MOS (DMOS) devices had been available in the prior art and are described, for example, in T. J. Rodgers, et al., "An Experimental and Theoretical Analysis of Double Diffused DMOS Transistors," *IEEE Journal of Solid State Circuits*, October 1975, pages 322–331. A cross-sectional view of a typical prior art DMOS device is shown in FIG. 1. It consists of a P-type silicon substrate 2 with an N-type epitaxial layer 4 deposited thereon and into which diffusions will be driven. Two diffusions are needed, a first P-type diffusion 8 defines a channel length of about 1 micron and a P-type diffusion 6 serves as the device isolation region. A second N-type diffusion is provided for the source 10 and drain 12 of the DMOS device. The effective channel region 14 lies between the region 16 of the N-type epitaxial layer 4 and the source 10. The device is completed by depositing a thin oxide layer 19 over the channel region 14. A thick oxide layer 18 is deposited over the rest of the device, with a window over the source region 10 to enable its contact with the source contact 20 and a window over the drain region 12 to enable the drain contact 24 to electrically contact the drain 12. A metal or polysilicon gate layer 22 is then deposited over the thin oxide region 19 to complete the device.

The principal advantage of the prior art DMOS device shown in FIG. 1 is its ability to define the channel length 14 of about 1 micron by means of hot processing steps rather than photolithographic techniques. However, this structure and fabrication process is not suited for a large scale integrated circuitry for several reasons. First, it requires an epitaxial layer 4 whose thickness of about 2 to 3 microns introduces variations which detract from the yield because of nucleation phenomena. Secondly, the isolation diffusion 6 tends to consume a great deal of silicon wafer area. Thirdly, an extra mask is required in order to open the window for the electrode 24 above the drain region 12, after the P-type diffusion 14 has taken place.

To overcome some of these drawbacks, modified DMOS structures have been introduced in the prior art, such as shown in FIG. 2. Here, a structure is obtained using a simpler processing sequence which eliminates the N-type epitaxial layer 4 of FIG. 1 and employs instead a single P-type substrate 26. Otherwise, the structure shown in FIG. 2 is the same as that shown in FIG. 1 and the reference symbols for the two figures are identical.

In the above-referenced publication by Rodgers, et al., it is analytically shown that in order to have the device of FIG. 2 approach the same drain-to-source current versus drain-to-source voltage characteristics of the device in FIG. 1, the following inequality must be satisfied:

$$\Delta V_T = (V_{TE} - V_{TD}) > \tfrac{1}{2} E_C L_D.$$

$V_{TE}$ is the threshold voltage corresponding to the heavily doped enhancement portion 14 of the channel, designated $L_E$. $V_{TD}$ corresponds to the lightly doped or depletion portion of the channel 16, designated $L_D$. $E_C$ is the critical electric field of $2 \times 10^4$ volts per centimeter where electron velocity saturation begins to set in.

In order to satisfy the inequality, the following steps could be taken. One could make $L_D$ short, on the order of 1 micron for $\Delta V_T$ of 2 volts. However this is not a practical option since it requires tight tolerances on mask dimensions and their alignment which is the type of problem which DMOS is supposed to avoid.

Alternately, one could make $V_{TD}$ as negative as possible by using a high resistivity substrate, as for example the 100 ohm-centimeter substrate described in K. Ohta, et al., "A High Speed Logic LSI Using Difusion Self-Aligned Enhancement Depletion MOS IC," *IEEE Journal of Solid State Circuits*, October 1975, pages 314,–322. However this option creates the problems of surface leakage and punchthrough.

OBJECTS OF THE INVENTION

It is an object of the invention to provide an improved diffused MOS device.

It is another object of the invention to provide an improved diffused MOS device which can be made by a simpler manufacturing process.

It is still a further object of the invention to provide a diffused MOS device having good current versus voltage characteristics.

It is yet a further object of the invention to provide an improved DMOS device which is not sensitive to variations in mask dimensions or alignment.

It is still a further object of the invention to provide a diffused MOS device which is not subject to excessive surface leakage or punchthrough.

SUMMARY OF THE INVENTION

These and other objects, features and advantages of the invention are accomplished by the improved DMOS device and method for making same, disclosed herein. A diffused MOS (DMOS) device and method for making same are disclosed. The prior art DMOS device is improved upon by ion implanting a depletion extension $L_D$ to the drain. However, the introduction of the depletion extension $L_D$ introduces a manufacturing statistical variation in the characteristics of the resultant devices so produced. The problem of the effects of the variations in the length $L_D$, and thus, variations in the resulting transconductance of the device, is solved by placing two of these devices in parallel. When one device has its $L_D$ relatively shorter, the companion device will also have its $L_D$ correspondingly longer. The method of producing the dual devices is by ion implanting a single conductivity region which forms the $L_D$ for both the left- and right-hand channels for the left- and right-hand DMOS structures. If the mask for the ion implanted region is misaligned slightly to the right, then the effective $L_D$ for the right-hand channel is somewhat longer but the effective $L_D$ for the left-hand channel is correspondingly shorter, so that the net parallel transconductance for the two devices remains the same as the transconductance for a perfectly symmetric ion-implanted region.

DESCRIPTION OF THE FIGURES

These and other objects, features and advantages of the invention will be more fully appreciated with reference to the accompanying figures.

DISCUSSION OF THE PREFERRED EMBODIMENT

A diffused MOS (DMOS) device and method for making same are disclosed. The prior art DMOS device is improved upon by ion implanting a depletion extension $L_D$ to the drain. However, the introduction of the depletion extension $L_D$ introduces a manufacturing statistical variation in the characteristics of the resultant devices so produced. The problem of the effects of the variations in the length $L_D$, and thus, variations in the resulting transconductance of the device, is solved by placing two of these devices in parallel. When one device has its $L_D$ relatively shorter, the companion device will have its $L_D$ correspondingly longer. The method of producing the dual devices is by ion implanting a single conductivity region which forms the $L_D$ for both the left- and right-hand channels for the left- and right-hand DMOS structures. If the mask for the ion implanted region is misaligned slightly to the right, then the effective $L_D$ for the right-hand channel is somewhat longer but the effective $L_D$ for the left-hand channel is correspondingly shorter, so that the net parallel transconductance for the two devices remains the same as the transconductance for a perfectly symmetric ion-implanted region.

Figure 1:
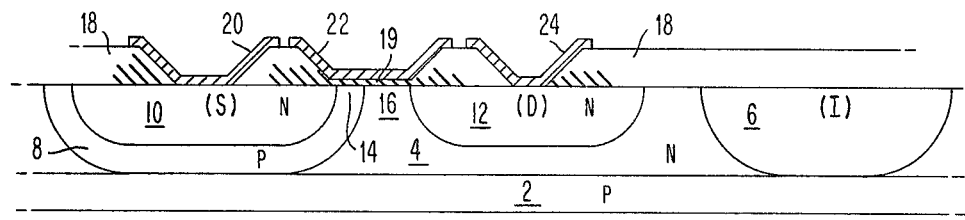
FIG. 1 is a cross-sectional view of a first example of the prior art.
Figure 2:
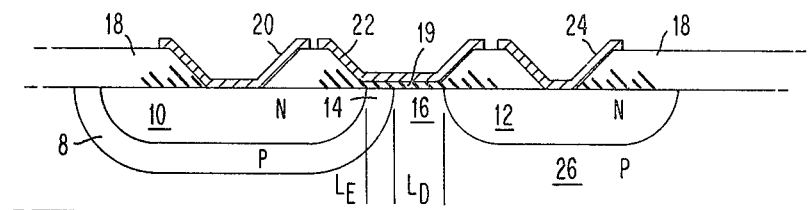
FIG. 2 is a cross-sectional view of a second example of the prior art.
Figure 3:
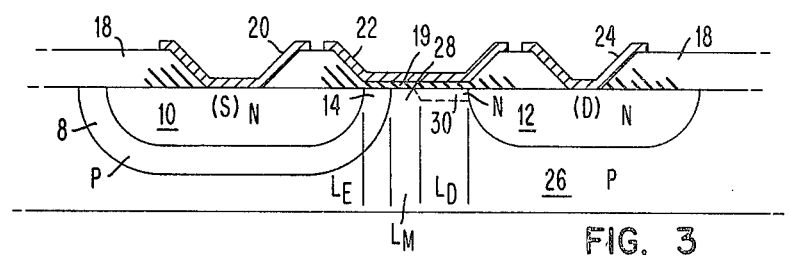
FIG. 3 is a cross-sectional view of the improved diffused MOS device.

To make the prior art device of FIG. 2 have the same drain-to-source current versus drain-to-source voltage characteristics as that for the prior art device of FIG. 1, it is one aspect of the invention to make $V_{TD}$ negative by partially implanting an N-type drain extension 30 to the diffused drain region 12 in the portion of the channel outside of the P-type diffusion 8, shown in FIG. 3. A sufficiently large space 28, designated $L_M$, must be left between the diffusion 8 and the nominal position of the edge of the implant 30 so that under worst case alignment conditions, enhancement channel 14, designated $L_E$, is not partially implanted. Thus there will be two doping levels outside the diffused channel region 14, as is shown in FIG. 3. All of the other numbering designations in FIG. 3 are identical to those shown in FIG. 2.

In FIG. 3, the implanted portion 30 of the channel is designated $L_D$ and the remaining portion at the original substrate doping is labeled $L_M$. A particular drawback of the structure shown in FIG. 3 is the dependence of the output current of the device on the magnitude of $L_M$. For substrate resistivities in the 2 ohm-centimeter range, $L_M$ must be 1 micron or less in magnitude in order to avoid such dependence. This would require a tight alignment tolerance between the gate and implantation mask since the implantation of the region 14 must be avoided.

Figure 5:
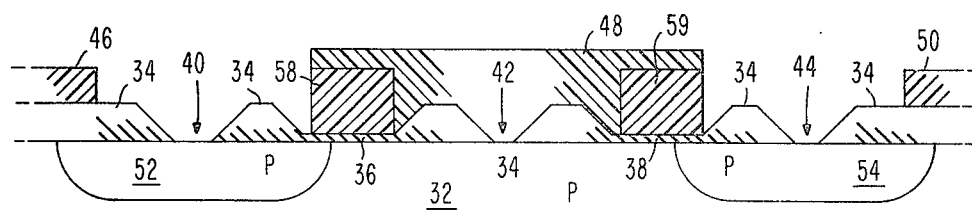
FIG. 5 is a cross-sectional view illustrating a first step in the fabrication of a dual DMOS device.
Figure 6:
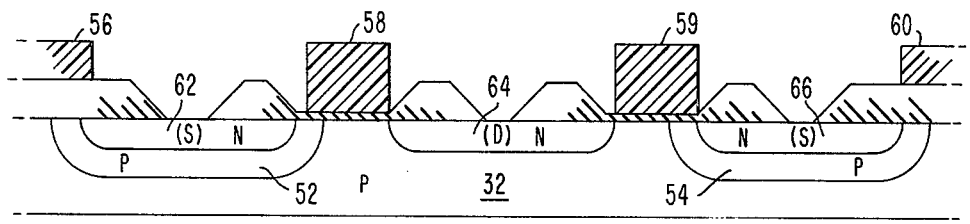
FIG. 6 is a cross-sectional view of a second step in the process of forming a dual DMOS device.
Figure 7:
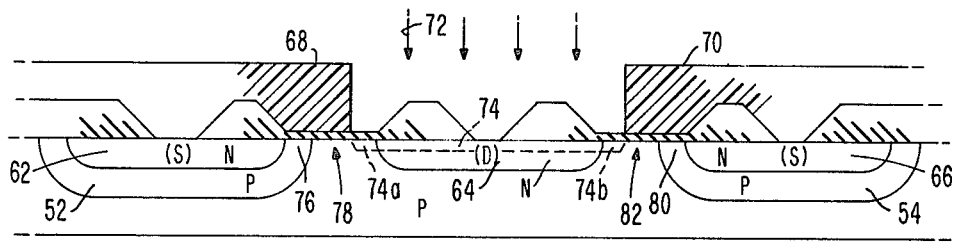
FIG. 7 is a cross-sectional view of a third step in the fabrication of a dual DMOS device.
Figure 8:
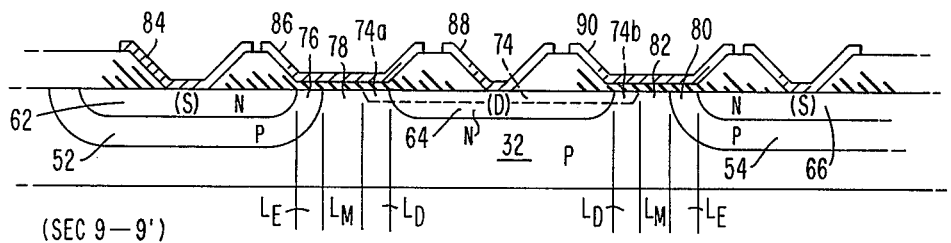
FIG. 8 is a cross-sectional view of the completed dual DMOS device invention.
Figure 9:
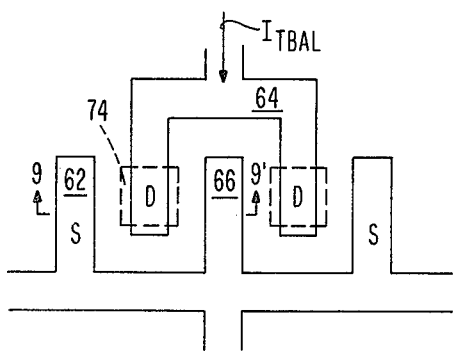
FIG. 9 is a plan view of the dual DMOS device shown in FIG. 8.

An improvement on the structure of FIG. 3, which eliminates the effects of the problem of misalignment is shown in FIGS. 8 and 9 and a sequence of processing steps for making the resultant device is shown in FIGS. 5, 6 and 7.

Figure 4:
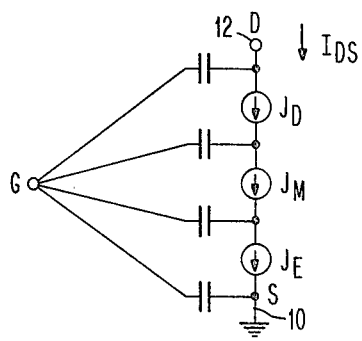
FIG. 4 is a schematic circuit diagram of the device shown in the FIG. 3.

In order to understand the advantages of the device shown in FIG. 8, it is necessary to examine the output current of the device in FIG. 3 as it depends upon variations in the magnitude of $L_M$. The schematic, three device circuit of FIG. 4 will illustrate this dependence. The drain-to-source current versus drain-to-source voltage characteristics for the circuit of FIG. 4 can be calculated based upon known device current models and parameters. The lengths $L_E$, $L_M$ and $L_D$ can be assigned a standard deviation for their statistical distributions and the effect of their fluctuations on the drain-to-source current can be studied. Using these distributions and other parameters at their nominal value, a sample size of 600 cases can be analyzed to obtain a statistical distribution which shows a fairly constant current for $L_M$ up to a certain magnitude and then a monotonically decreasing current for a longer $L_M$. Therefore, it is apparent that the drain-to-source current for the device of FIG. 3 will have a significant batch-to-batch variation due to mask misalignment.

FIGS. 5 through 9 illustrate the dual diffused MOS device which overcomes the problems associated with the device of FIG. 3. By paralleling two ion-implanted DMOS devices, the dependence of the output current on implant alignment can be reduced. FIG. 8 shows a pair of DMOS devices which share a common drain diffusion 64 and a single implant region 74 that straddles the common drain 64. As is seen in FIG. 8, a P-type substrate 32 has P-type diffusion 52 and an N-type diffusion 62 formed through a source window in the silicon dioxide layer 18, creating the diffused channel region 76. A second DMOS device is formed in the P-type substrate 32 with the P-type diffusion 54 and the N-type diffusion 66 passing through a second source window in the silicon dioxide layer 18 forming a second diffused channel region 80. The diffused N-type drain region 64 is deposited through a drain window in the silicon dioxide layer 18, midway between the source 62 and the source 66. An N-type ion-implanted region 74 straddles the diffused drain region 64, with the first end 74a extending into the channel region 78 for the first device, and a second end 74b extending into the channel region 82 for the second device.

In FIG. 8, when, due to misalignment, one DMOS device has a relatively long magnitude for the channel region 78, designated $L_M$, the companion device has a relatively short magnitude $L_M$ for region 82, which yields a corresponding excess current, which balances the current deficit in the first device. Any variations in the output current for the pair of devices is then reduced. A plan view of the dual DMOS device as shown in FIG. 8, is seen in FIG. 9.

A fabrication process performing the dual DMOS devices of FIG. 8, is shown in the sequence of FIGS. 5, 6 and 7. The step of FIG. 5 starts with the P-type substrate 32 covered with a silicon dioxide layer 34 having windows 40, 42 and 44 therein. A hardened photo-resist master image mask technique, such as is disclosed in U.S. Pat. No. 4,110,126 by D. L. Bergeron, et al., is employed to align the subsequent ion-implanted regions. In FIG. 5, a hardened photoresist master image mask is deposited on the surface of the silicon dioxide layer 34, leaving the regions 46, 58, 59 and 50 located as shown with respect to the windows 40, 42 and 44. Next, a dissolvable photoresist layer 48 is deposited covering the hardened photoresist layer portions 58 and 59 and the window 42, therebetween. At this stage, the P-type regions 52 and 54 can be ion implanted through the exposed portion of the hardened photoresist master image mask.

With respect to FIG. 6, the dissolvable photoresist blocking mask 48 is removed and an N-type ion-implantation step deposits the N-type source region 62, drain region 64, and source region 66, as shown.

In FIG. 7, the hardened photoresist master image mask is removed and a conventional photoresist mask layer is deposited on the surface, leaving portions 68 and 70 having their respective edges falling approximately midway in the channel regions 78 and 82, respectively. An N-type ion-implantation step 72 deposits the N-type layer 74 which straddles the N-type drain region 64, and extends at a first end 74a into the first channel region 78 and extends at a second end 74b into the second channel region 82. The balance of the processing, forming the source and drain electrodes and the gate electrodes is carried out in the conventional manner.

The invention enables conventional metal gate structures with low resistivity substrates to be adapted for DMOS structures by ion implanting a depletion channel outside of the diffused drain region. By paralleling a pair of DMOS devices which are implanted through a window centered about a common drain diffusion, the sensitivity of the source-to-drain current to the length of drain extensions and mask misalignments is reduced. This arrangement is very attractive for interdigitated layouts commonly used for off chip drivers which require extra current-carrying capacity as is available in the dual DMOS device, disclosed herein.

While the invention has been particularly shown and described with reference to the preferred embodiment thereof, various changes in form and detail may be made therein without departing from the spirit and the scope of the invention. For example, the metal gates 86 and 90 can also be composed of polycrystalline silicon material.

Having thus described our invention, what we claim as new, and desire to secure by Letters Patent is:

1. A method for forming a pair of mutually compensated diffused MOS devices having a predictable transconductance, comprising the steps of:
    simultaneously forming a first and second channel regions of a first conductivity type in a semiconductor substrate of said first conductivity type, separated by a first distance;
    simultaneously forming a first and second source regions of a second conductivity type within said first and second channel regions of said first conductivity type;
    forming a third drain region of said second conductivity type between said first and second channel regions of said first conductivity type, having a first separation distance from said first channel region of said first conductivity type and a second separation distance from said second channel region of said first conductivity type, for a common drain of two FET devices having said first and second regions of said second conductivity type as the respective sources of said two FET devices;
    ion implanting a conductivity layer of said second conductivity type in said substrate over said third drain region of said second conductivity type, which extends into said region separating said third drain region of said second conductivity type from said first channel region of said first conductivity type and which extends into said region separating said third drain region of said second conductivity type from said second channel region of said first conductivity type;
    simultaneously depositing a first gate electrode over the region separating said third drain region and said first source region and a second gate electrode over the region separating said third drain region and said second source region;
    whereby a parallel connected pair of FET devices is formed wherein the transconductance of the first FET device compensates for the error due to misalignment, in the transconductance of the second FET device.

2. The method of claim 1 which further comprises:
    said first and second regions of said first conductivity type being diffused dopant regions;
    said first and second regions of said second conductivity type being diffused dopant regions.

3. The method of claim 2 wherein said first conductivity type is P-type conductivity and said second conductivity type is N-type conductivity.

4. The method of claim 2 wherein said first conductivity type is N-type conductivity and said second conductivity type is P-type conductivity.

5. The method of claim 1, wherein said first and second regions of said first conductivity type are ion-implanted regions;
    and said first and second regions of said second conductivity type are ion-implanted regions.

6. The method of claim 5 wherein said first conductivity type is P-type conductivity and said second conductivity type is N-type conductivity.

7. The method of claim 5 wherein said first conductivity type is N-type conductivity and said second conductivity type is P-type conductivity.

* * * * *